(12) United States Patent
Wong et al.

(10) Patent No.: US 7,286,810 B1
(45) Date of Patent: Oct. 23, 2007

(54) CAPACITOR LOAD MIXER WITH PAM FUNCTION

(75) Inventors: Hee Wong, San Jose, CA (US); Shu-Ing Ju, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 467 days.

(21) Appl. No.: 10/688,842

(22) Filed: Oct. 17, 2003

(51) Int. Cl.
*H04B 1/16* (2006.01)
*H04B 7/00* (2006.01)

(52) U.S. Cl. .................... 455/323; 455/313; 455/334

(58) Field of Classification Search ............... 455/323, 455/333, 334, 339, 341, 130, 131, 136, 138, 455/141, 177.1, 208, 232.1, 236.1, 240.1, 455/255, 293
See application file for complete search history.

(56) References Cited

U.S. PATENT DOCUMENTS

| | | | | |
|---|---|---|---|---|
| 6,301,306 B1 * | 10/2001 | McDonald et al. | ......... | 375/259 |
| 6,417,737 B1 * | 7/2002 | Moloudi et al. | ............ | 330/301 |
| 6,714,776 B1 * | 3/2004 | Birleson | ...................... | 455/302 |
| 2004/0142674 A1 * | 7/2004 | Kuiri | .......................... | 455/334 |

* cited by examiner

*Primary Examiner*—Tony T. Nguyen

(57) ABSTRACT

A phase alternating mixer is implemented by common-base differential transistor pairs, with two cross-coupled pairs providing a switching mixer function with harmonic gating suppression of harmonic responses to the switching mixing by control of local oscillator signals controlling switching of the differential transistor pairs. Rather than a resistive load, a switched capacitance load and integrating capacitors are connected to the output of the differential transistor pairs to provide first order low pass filtering of the double sideband output from the differential pairs, with a controlled bandwidth. Channel select switches demultiplex the double sideband signal into a baseband signal.

20 Claims, 5 Drawing Sheets

US 7,286,810 B1

CAPACITOR LOAD MIXER WITH PAM FUNCTION

TECHNICAL FIELD OF THE INVENTION

The present invention is directed, in general, to mixing circuits for radios and, more specifically, to a direct conversion mixer for a phase-alternating mixer circuit.

BACKGROUND OF THE INVENTION

An architecture for high-performance direct conversion radios is disclosed in co-pending U.S. patent application Ser. No. 10/440,026 entitled "CHOPPER-DIRECT-CONVERSION (CDC) RADIO ARCHITECTURE" and filed May 16, 2003, the content of which is incorporated herein by reference. The architecture disclosed employs a phase-alternating mixer (PAM) that outputs a double-sideband (DSB) signal for use throughout the receiver circuitry. Such double-sideband signal paths eliminate the use of baseband frequencies that are generally problematic in large-scale circuit integration. In addition, problems associated with direct-conversion, such as local oscillator (LO) leakages, direct current (DC) offsets, low frequency noise and the like are all eliminated by relocating the local oscillator frequency away from the radio frequency (RF) employed for transmission. In addition, harmonic rejection for such an architecture is disclosed in co-pending U.S. patent application Ser. No. 10/457,825 entitled "HARMONIC REJECTION GATED-SWITCHING MIXER" and filed Jun. 9, 2003, and combined alias and harmonic rejection for such an architecture is disclosed in co-pending U.S. patent application Ser. No. 10/464,424 entitled "PHASE-ALTERNATING MIXER WITH ALIAS AND HARMONIC REJECTION" and filed Jun. 18, 2003, the content of which is incorporated herein by reference.

There is, therefore, a need in the art for a low cost direct conversion mixer implementing a phase alternating mixer function.

SUMMARY OF THE INVENTION

To address the above-discussed deficiencies of the prior art, it is a primary object of the present invention to provide, for use in a chopper-direct-conversion radio, a phase alternating mixer implemented by common-base differential transistor pairs, with two cross-coupled pairs providing a switching mixer function with harmonic gating suppression of harmonic responses to the switching mixing by control of local oscillator signals controlling switching of the differential transistor pairs. Rather than a resistive load, a switched capacitance load and integrating capacitors are connected to the output of the differential transistor pairs to provide first order low pass filtering of the double sideband output from the differential pairs, with a controlled bandwidth. Channel select switches demultiplex the double sideband signal into a baseband signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
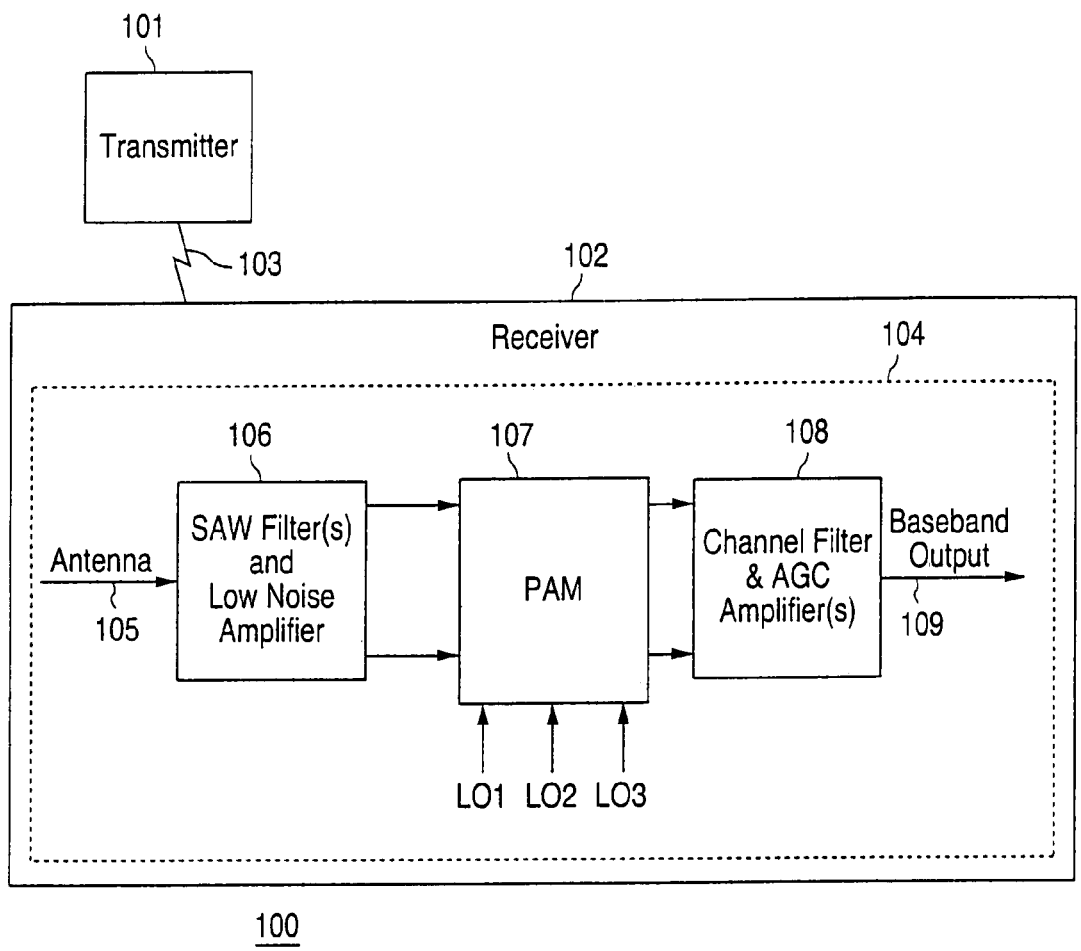
FIG. 1 depicts a wireless communications system including a chopper-direct-conversion receiver having a capacitive load mixer with phase alternating mixer functions according to one embodiment of the present invention.

FIG. 1 depicts a wireless communications system including a chopper-direct-conversion receiver having an alias and harmonic rejection phase alternating mixer according to one embodiment of the present invention. Wireless communications system 100 includes a transmitter 101, a receiver 102, and at least one communications channel 103 communicably coupling the transmitter 101 and receiver 102. Wireless communications system 100 may be employed for voice communications, video transmission or data transmission. Accordingly, receiver 102 may be a mobile telephone, a satellite or terrestrial television receiver, a data processing system such as a wireless personal digital assistant (PDA) with Internet access capabilities, or some combination thereof.

Those skilled in the art will recognize that the complete structure and operation of a wireless communications system or a receiver therein are not depicted or described herein. Instead, for simplicity and clarity, only so much of a wireless communications system and associated receiver as is unique to the present invention or necessary for an understanding of the present invention is depicted and described.

Receiver 102 preferably employs the chopper-direct-conversion (CDC) architecture described in the related applications identified above. In an embodiment of that architecture relevant to the present invention, a single phase alternating mixer and one or more local oscillator frequencies are employed. Accordingly, receiver 102 includes a circuit 104, preferably implemented in a single integrated circuit, receiving a wireless radio frequency (RF) signal on an input 105 from an antenna (not shown).

The received signal is passed through surface acoustic wave (SAW) filter(s) and low noise amplifier (LNA) 106, then split into a differential signal and passed as dual inputs to a phase-alternating mixer (PAM) 107 controlled by three local oscillator (LO) signals LO1, LO2 and LO3. The output of the phase-alternating mixer circuit 107 is passed through a channel filter and automatic gain control (AGC) amplifier(s) 108 to produce the baseband output signal at output 109.

Figure 2:
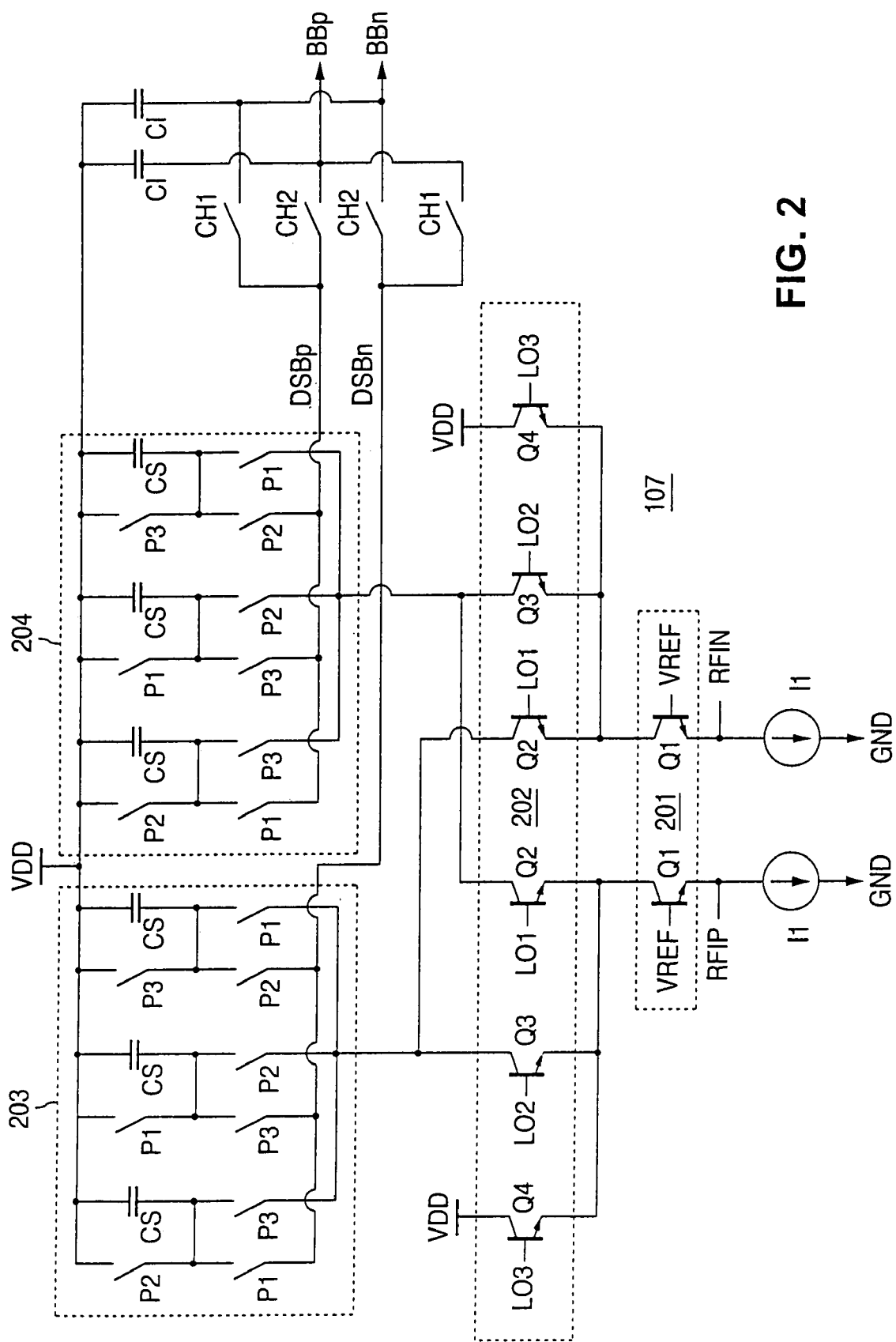
FIG. 2 is a circuit diagram illustrating a capacitive load mixer with phase alternating mixer functions according to one embodiment of the present invention.

FIG. 2 is a circuit diagram illustrating a capacitive load mixer with phase alternating mixer functions according to one embodiment of the present invention. The present invention employs a low cost bipolar complementary metal-oxide-semiconductor (BiCMOS) direct conversion mixer design based on the requirements identified for a phase alternating mixer with alias and harmonic rejection in the related application listed above. A bipolar Gilbert cell mixer with a common-base radio frequency (RF) input stage is employed. The conventional resistor load for the mixer is replaced by a capacitor load, with a passive low pass filter implemented right at the double sideband output DSBp and DSBn to remove the high frequency component.

The approach of the present invention provides a mixer with an accurate low pass bandwidth that cannot be easily achieved using a conventional resistive load mixer. Three load capacitors are provided for each double sideband output DSBp and DSBn, which are alternately switched between mixer and integration capacitors. The three capacitor configuration improves the switching timing requirement and avoids any unwanted signal within the desired signal frequency band that might otherwise result from circuit mismatch.

Phase alternating mixer 107 in the present invention is essentially a Gilbert cell mixer with an integrated phase alternating mixing function. Differential current inputs RFIP and RFIN, which are alternating current (AC) coupled from the low noise amplifiers 106, are received at nodes connected by current sources I1 to ground voltage GND. The first stage 201 of the phase alternating mixer 107 is a common base input stage including bipolar junction transistor pair Q1, connected at the emitters to the nodes receiving input signals RFIP and RFIN and at the base to a reference voltage VREF.

The RF input current RFIP and RFIN are passed through the first stage 201 to the second stage 202, which contains three differential bipolar junction transistor pairs Q2, Q3 and Q4. The collectors of transistors Q1 are connected to a common node connecting the emitters for transistors Q2, Q3 and Q4. The first two transistor pairs Q2 and Q3, with cross-coupled collectors and controlled by local oscillator signals LO1 and LO2, perform the function of a switching mixer as described in the related application. The harmonic gating function described in the related application is implemented by switching the first two differential transistor pairs Q2 and Q3 in the second stage 202. The third differential transistor pair Q4 steers the signal current into the second stage 202 when the first two differential transistor pairs Q2 and Q3 are shut off.

Figure 3A:
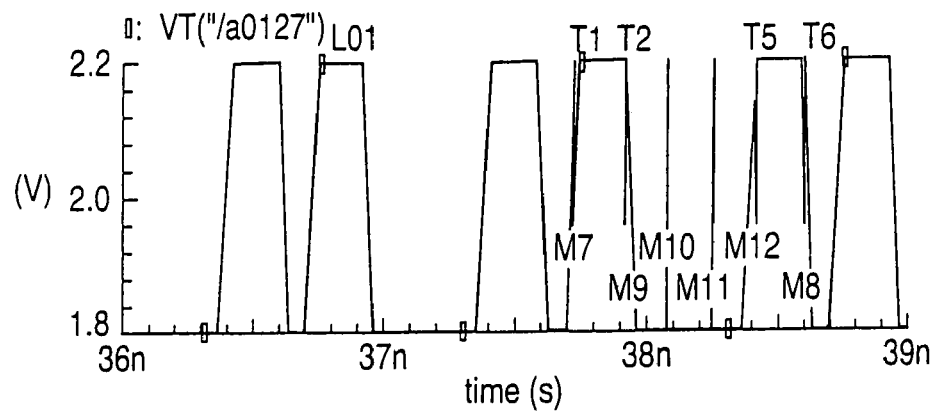
FIGS. 3A through 3C illustrate timing waveforms for local oscillator signals within a capacitive load mixer with phase alternating mixer functions according to one embodiment of the present invention.
Figure 3B:
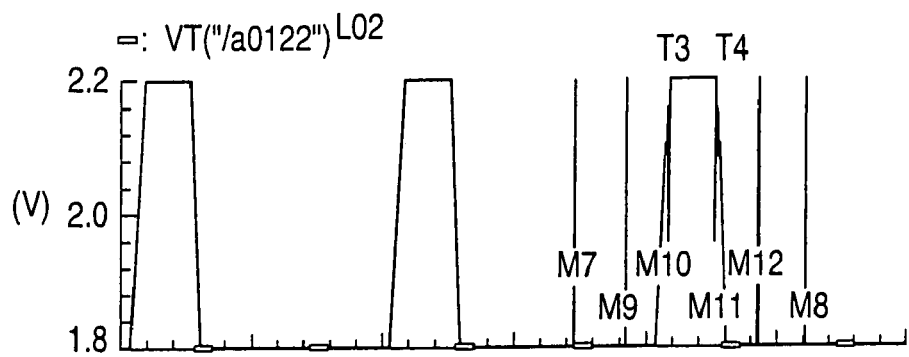

FIGS. 3A through 3B illustrate timing waveforms for local oscillator signals within a capacitive load mixer with phase alternating mixer functions according to one embodiment of the present invention. Timing in the second stage 202 is controlled by three local oscillator signals LO1, LO2 and LO3. As may be seen, the switching alternates two successive duty cycles for local oscillator LO1 with one for local oscillator LO2, with local oscillator LO3 asserted during the intervening periods when both LO1 and LO2 are switched off.

Stacked on top of the second stage 202 are capacitive loads (including switched capacitor networks 203 and 204 and capacitors CI) and switches CH1 and CH2. DSBp and DSBn are double sideband signals running at one third the RF input frequency, and are converted into baseband output signals BBp and BBn with the high frequency component filtered out by a first order switched capacitor low pass filter. The three load capacitors CS for each double sideband output signal DSBp and DSBn alternately: integrate the mixer output current and sample the output voltage; transfer charge from the load capacitor to the integration capacitor CI of the first order low pass filter; and dump out all charge of the load capacitor CS.

During the first step, the load capacitor CS integrated the mixer output current and generated the output voltage signal, which is either DSBp or DSBn. The output voltages of DSBp and DSBn have a direct current (DC) content and AC content which may be defined by:

$$DSBp = Vdc + Vacp; \text{ and}$$

$$DSBn = Vdc + Vacn.$$

Figure 3C:
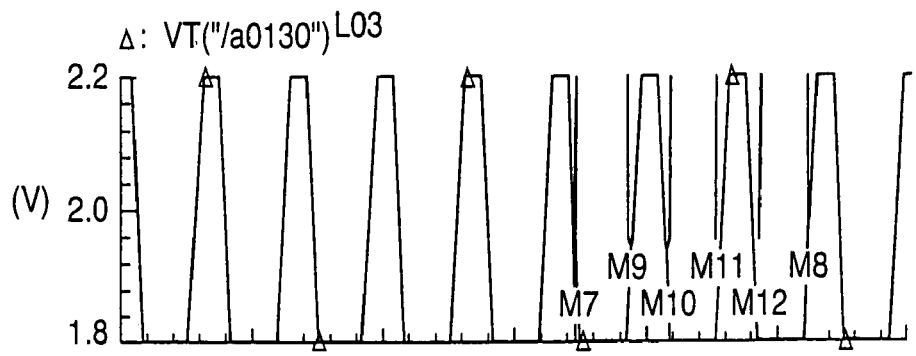

Immediately before switching to the second step, the DC content Vdc and the AC content Vacp or Vacn of DSBp and DSBn are defined by:

$$Vdc = VDD - \left(\frac{1}{CS}\left(\int_{T1}^{T2} I1\,dt + \int_{T}^{T4} I1\,dt + \int_{T5}^{T6} I1\,dt\right)\right),$$

$$Vacp = \frac{1}{CS}\left(\int_{T1}^{T2} RFIP\,dt + \int_{T3}^{T4} RFIN\,dt + \int_{T5}^{T6} RFIP\,dt\right), \text{ and}$$

$$Vacn = \frac{1}{CS}\left(\int_{T1}^{T2} RFIN\,dt + \int_{T3}^{T4} RFIP\,dt + \int_{T5}^{T6} RFIN\,dt\right),$$

where VDD is the power supply voltage, CS is the capacitance of the load capacitors CS, I1 is the current of current sources I1, and RFIP and RFIP are the input currents. As illustrated in FIGS. 3A through 3C, times T1 and T2 in the equations above are respectively the start and stop of the last of a pair of successive LO1 duty cycles, times T3 and T4 are respectively the start and stop of a LO2 duty cycle intervening between two sequential successive pairs of LO1 duty cycles, and times T5 and T6 are respectively the start and stop of the first of a pair of successive LO1 duty cycles.

After the first step, the double sideband signals DSBp and DSBm are demutliplexed by switches CH1 and CH2 to baseband signals BBp abd BBn. In the example shown in FIG. 2, a passive first order low pass switched capacitor filter is employed to interface the double sideband signals DSBp and DSBn. In addition, the baseband signals BBp and BBn demultiplexed from the double sideband signals DSBp and DSBn in the exemplary embodiment are also filtered by the first order switched capacitor networks 203 and 204. The bandwidth of the filter is well controlled and defined by the ratio of load capacitance CS to integration capacitance CI and the sampling frequency fs as follows:

$$fo(3\text{dB}) = \frac{CS}{CI} \times fs.$$

The well controlled bandwidth gives the mixer the capability of rejecting the next channel energy right at the output.

During the last step, the load capacitor CS will empty all the charge and be prepared for the first step again. After completing the three steps, each load capacitor CS repeats the steps from the beginning.

Figure 4:
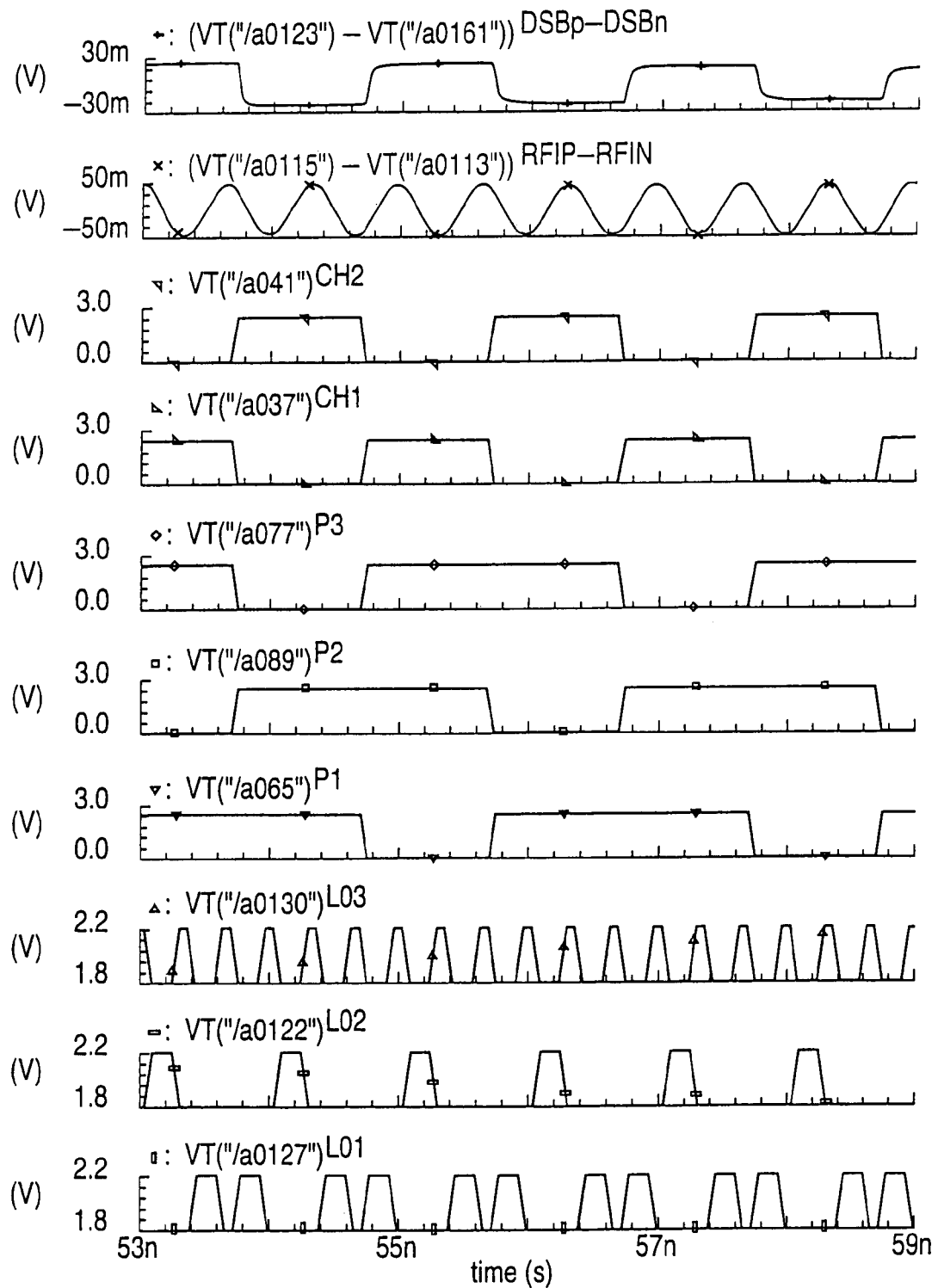
FIG. 4 comparatively illustrates timing wave-forms for operation of a capacitive load mixer with phase alternating mixer functions according to one embodiment of the present invention.

FIG. 4 comparatively illustrates timing wave-forms for operation of a capacitive load mixer with phase alternating mixer functions according to one embodiment of the present invention. Each of the three steps described above for switched capacitor networks 203 and 204 is controlled by clocks P1, P2 and P3. In the exemplary timing diagram of FIG. 4, the switches controlled by signals P1, P2 and P3 (and identified by those references) are active low switches.

The frequency of clock signals P1, P2 and P3 is two-thirds of the frequency of the double sideband output signals DSBp and DSBn, with a duty cycle of one third of the period. Switching the load capacitors CS at two-thirds of the double sideband signals' frequency has at least two advantages: First, each capacitor has more time for each operation. Second, any mismatch caused by the capacitors and switches will generate an unwanted signal, but, instead of falling within the desired signal band at the frequency band of the double sideband signals DSBp and DSBn, the unwanted signal shows up at two-thirds of the double sideband signals' frequency. After demultiplexing to baseband, the unwanted signal is moved to one-third of the double sideband signals' frequency, where the unwanted signal can be easily filtered out with a low pass filter.

Conventionally, the load of a mixer is a resistor, with the low pass function performed by the load resistance and load capacitance for a low pass 3 decibel (dB) bandwidth defined by the product of the load resistance and load capacitance. However, the variations of the load resistance and load capacitance from one integrated circuit device to another are normally not small. Accordingly, due to the large variation of the 3 dB bandwidth, a resistor-based load mixer cannot be employed to reject the next channel energy without frequency tuning, but instead can only be used to remove the high frequency content of the mixing products. In contrast, the present invention can provide a channel select filter function by control of switches CH1 and CH2.

Figure 5:
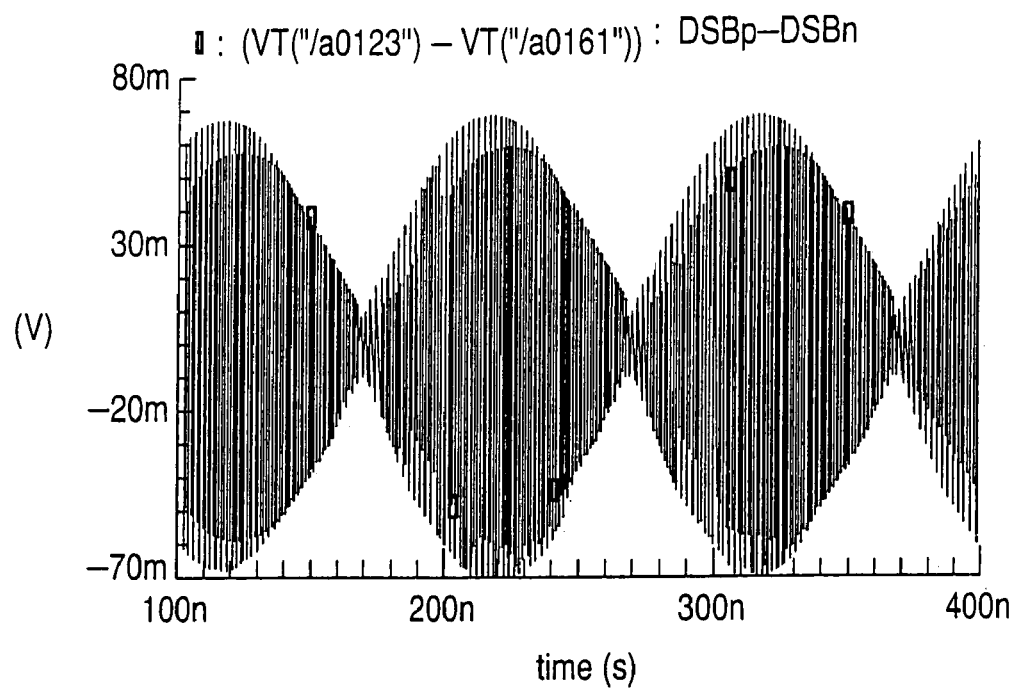
FIG. 5 illustrates the double sideband output signal for a capacitive load mixer with phase alternating mixer functions according to one embodiment of the present invention.
Figure 6:
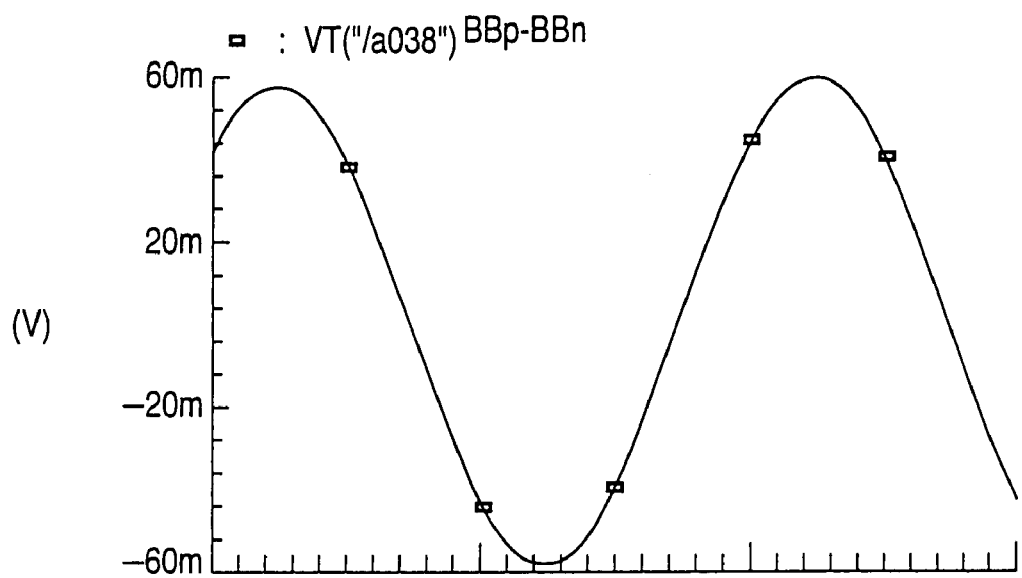
FIG. 6 illustrates the baseband output signal for a capacitive load mixer with phase alternating mixer functions according to one embodiment of the present invention.

FIGS. 5 and 6 illustrate, respectively, the double sideband and baseband output signals for the phase alternating mixer 107 depicted in FIG. 2 under control of signals illustrated in FIG. 4.

The present invention implements a traditional Gilbert cell mixer with a switched capacitor load to provide a phase alternating mixer function. Fabricated with a BiCMOS process, the design is a low cost version of a phase alternating mixer, without any need for a frequency tuning circuit since the mixer output is low pass filtered with a fixed bandwidth. The approach of the present invention can also provide the function of a channel select filter, to reduce the cost of channel select filtering. The output is not limited to a baseband signal since, depending on the application, the baseband signal may be reconverted to a double sideband signal running at a different sampling frequency.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A mixing circuit comprising:
   one or more switching devices performing switching mixing of input signals with harmonic gating suppression of harmonic responses to the switching mixing, wherein at least one of the switching devices switches a first and a second differential transistor pair off for a period between each period during which one of the first and the second differential transistor pairs is switched on; and
   a capacitive load coupled to the one or more switching devices and forming a low pass filter operating on an output of the one or more switching devices.

2. The mixing circuit according to claim 1, wherein the one or more switching devices comprise two differential transistor pairs controlled by local oscillator signals to perform the switching mixing and harmonic gating suppression.

3. The mixing circuit according to claim 2, wherein the local oscillator signals alternate switching a first differential transistor pair on for two periods in succession with switching a second differential transistor pair on for a single period.

4. The mixing circuit according to claim 1, wherein the capacitive load further comprises:
   a network of switched load capacitors; and
   an integration capacitor,
   wherein the switched load capacitors integrate output current from the one or more switching devices for a period, sample an output voltage of the switched load capacitors following the period and transfer charge based on the sampled output voltage to the integration capacitor, and dump all accumulated charge.

5. The mixing circuit according to claim 4, wherein the network of switched load capacitors is controlled by signals having a clock frequency of two-thirds of a frequency of the output current and a duty cycle of one-third of a period of the output current.

6. The mixing circuit according to claim 1, further comprising:
switches demultiplexing a double sideband output signal from the one or more switching devices into a baseband output signal.

7. A receiver including the mixing circuit according to claim 1, the receiver further comprising:
a low noise amplifier coupling a received signal to the mixing circuit; and
at least one filter coupled to an output of the mixing circuit.

8. A communications system including the mixing circuit according to claim 1, the communications system further comprising:
a transmitter; and
a receiver including the mixing circuit and receiving a signal from the transmitter, wherein the mixing circuit operates on the signal received from the transmitter.

9. A method of operating a mixing circuit comprising:
employing one or more switching devices to perform switching mixing of input signals with harmonic gating suppression of harmonic responses to the switching mixing, wherein at least one of the switching devices switches a first and a second differential transistor pair off for a period between each period during which one of the first and the second differential transistor pairs is switched on; and
driving a capacitive load coupled to the one or more switching devices and forming a low pass filter operating on an output signal from the one or more switching devices with the output signal.

10. The method according to claim 9, wherein the one or more switching devices comprise two differential transistor pairs controlled by local oscillator signals to perform the switching mixing and harmonic gating suppression.

11. The method according to claim 10, wherein the local oscillator signals alternate switching a first differential transistor pair on for two periods in succession with switching a second differential transistor pair on for a single period.

12. The method according to claim 9, wherein the capacitive load further comprises:
a network of switched load capacitors; and
an integration capacitor,
wherein the switched load capacitors integrate output current from the one or more switching devices for a period, sample an output voltage of the switched load capacitors following the period and transfer charge based on the sampled output voltage to the integration capacitor, and dump all accumulated charge.

13. The method according to claim 12, wherein the network of switched load capacitors is controlled by signals having a clock frequency of two-thirds of a frequency of the output current and a duty cycle of one-third of a period of the output current.

14. The method according to claim 9, further comprising:
demultiplexing a double sideband output signal from the one or more switching devices into a baseband output signal.

15. A phase alternating mixing circuit comprising:
an input stage receiving differential input signals;
a mixing stage receiving a differential input current representative of the input signals, the input stage comprising first and second differential transistor pairs switched under the control of first and second local oscillator signals, respectively, to perform switching mixing on the input current with harmonic gating suppression of harmonic responses to the switching mixing, wherein the first differential transistor pair is switched on for a first period, off for a second period, on for a third period, and off for a fourth period while the second differential transistor pair is switched off for the first, second and third periods and on for a portion of the fourth period equal to the first and third periods; and
a capacitive load coupled to the switching stage and forming a low pass filter operating on an output of the switching stage.

16. The phase alternating mixing circuit according to claim 15, wherein the first and second local oscillator signals producing a switching pattern in which
the fourth period includes two periods equal to the second period during which both the first and second differential transistor pairs are switched off.

17. The phase alternating mixing circuit according to claim 16, wherein outputs of the first and second differential transistor pairs are cross-coupled, the first and second differential transistor pairs producing double sideband output signals.

18. The phase alternating mixing circuit according to claim 17, wherein the capacitive load further comprises:
first and second networks of switched load capacitors connected respectively to first and second outputs of the mixing stage, the first and second networks switched by signals having a clock frequency of two-thirds of a frequency of the double sideband output signals and a duty cycle of one-third of a period of the double sideband output signals; and
integration capacitors each connected to one of the first and second outputs of the mixing stage.

19. The phase alternating mixing circuit according to claim 18, further comprising:
switches demultiplexing the double sideband output signals from the one or more switching devices to produce a baseband output signal.

20. The phase alternating mixing circuit according to claim 19, wherein each network of switched load capacitors includes three capacitors.

* * * * *